(12) United States Patent
Kim

(10) Patent No.: US 6,806,188 B2
(45) Date of Patent: Oct. 19, 2004

(54) SEMICONDUCTOR DEVICE CAPABLE OF PREVENTING RING DEFECT AND METHOD OF MANUFACTURING THE SAME

(75) Inventor: Si Youn Kim, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 76 days.

(21) Appl. No.: 10/108,700

(22) Filed: Mar. 29, 2002

(65) Prior Publication Data

US 2003/0170979 A1 Sep. 11, 2003

(30) Foreign Application Priority Data

Mar. 9, 2002 (KR) ..................................... 2002-0012736

(51) Int. Cl.⁷ .......................... H01L 21/44; H01L 29/76
(52) U.S. Cl. ........................ 438/675; 438/424; 438/425; 438/253; 438/254; 438/396; 438/397; 257/296; 257/306; 257/297; 257/298; 257/300
(58) Field of Search ................................ 438/675, 424, 438/425, 270, 282, 253, 397, 396, 254; 257/296, 297, 298, 300, 306–311

(56) References Cited

U.S. PATENT DOCUMENTS 5,953,609 A  *  9/1999  Koyama et al. ............. 438/253
6,066,541 A  *  5/2000  Hsieh et al. ................. 438/397

* cited by examiner

Primary Examiner—Matthew Smith
Assistant Examiner—Igwe U. Anya
(74) Attorney, Agent, or Firm—Volentine Francos & Whitt, PLLC

(57) ABSTRACT

A semiconductor device capable of preventing a ring defect and a method of manufacturing the same are provided. The semiconductor device includes a semiconductor substrate having a junction region, a planarization layer having a first contact hole portion through which the junction region is exposed, an interlayer dielectric layer formed on the planarization layer and having a second contact hole portion extended from the first contact hole portion, and contact spacers formed at the sidewalls of the first and second contact hole portions. Here, the contact spacers are formed to cover the interface between the planarization layer and the interlayer dielectric layer and the interface between the planarization layer and the semiconductor substrate.

22 Claims, 3 Drawing Sheets

SEMICONDUCTOR DEVICE CAPABLE OF PREVENTING RING DEFECT AND METHOD OF MANUFACTURING THE SAME

CROSS REFERENCES TO RELATED APPLICATIONS

This application claims the benefit under 35 U.S.C. §119 of Korean Patent Application No. 2002-12736, filed on Mar. 9, 2002, the entirety of which is hereby incorporated herein by reference for all purposes as if fully set forth herein.

BACKGROUND OF THE INVENTION

1. Field of the Invention

The present invention relates to a semiconductor device and a method of manufacturing the same, and more particularly, to a semiconductor device capable of preventing a ring defect, which may occur in an interlayer dielectric layer when forming conductive lines, such as bitlines, and a method of manufacturing the same.

2. Description of the Related Art

As the integration density of semiconductor devices has increased, research has been carried out more vigorously on a multilayered wiring layer technique which enables free and easy design of wiring layers and reduces wiring layer resistance and capacitance.

In the multilayered wiring layer technique, a complex resin material layer, such as a borophosphosilicate glass (BPSG) layer or a phosphosilicate glass (PSG) layer, or a spin on glass (SOG) layer is used as a planarization insulation layer in order to prevent a disconnection of upper wiring layers due to the unevenness of the lower wring layers. Since a SOG layer is weak in processes performed at a high temperature, it is used only in processes for forming upper metal wiring layers. A BPSG layer is used as a planarization layer in processes for forming lower transistors, bitlines, and capacitors.

A BPSG layer is composed of $B_2O_3$, $P_2O_5$, and $SiO_2$ and is planarized by a predetermined heat treatment, for example, a flow process, after the deposition. The flow process may be performed at a high temperature of no less than 850° C., and the temperature may be varied according to the components of a layer, and the process time and atmosphere of the flow process.

Here, a method of manufacturing a conventional semiconductor device having an interlayer dielectric layer formed of a BPSG layer will be described with reference to FIG. 1.

Referring to FIG. 1, an isolation layer 12 is formed on a semiconductor substrate 10. Next, a gate oxide layer 14, a conductive layer 16, and a capping layer 18 are sequentially deposited on the semiconductor layer 10 and are patterned to form a gate electrode structure (G). Next, a silicon nitride (SiN) layer is deposited on the semiconductor substrate 10 and is etched to form spacers 20 at either sidewall of the gate electrode structure (G) by blanket-anisotropic etching. Next, impurities are implanted into the semiconductor substrate 10 at either side of the gate electrode structure (G), thereby forming a junction region 25.

Next, in order to alleviate the step difference of the semiconductor substrate 10 caused by the gate electrode structure (G), a BPSG layer 30 is deposited on the semiconductor substrate 10 and is heat-treated at a predetermined temperature to be flowed. Next, an interlayer dielectric layer 32 is deposited on the flowed BPSG layer 30. The interlayer dielectric layer 32 is introduced to help the BPSG layer 30 to more strongly stick to conductive lines to be formed later.

Next, the inter layer dielectric layer 32 and the BPSG layer 30 are etched to expose the junction region 25, thereby forming a contact hole. Since the BPSG layer 30 has a higher etching rate than the interlayer dielectric layer 32, the BPSG layer 30 is etched much more than the interlayer dielectric layer 32 so that the sidewalls of the contact hole are formed as a bow shape, which is called a bowing phenomenon. In FIG. 1, "b" represents the portion of the interlayer dielectric layer, at which the bowing phenomenon occurs.

Next, contact spacers 35 are formed at the sidewalls of the contact hole. Next, the surface of the exposed junction region 25 is cleaned, and then a bitline 40 is formed to contact the exposed junction region 25.

However, since the conventional semiconductor device described above has the contact hole whose sidewalls are formed as a bow shape, the widths of the upper and lower portions of each of the contact spacers 35 are relatively narrow. In addition, if a cleaning process is performed before the formation of the bitline 40, a thickness of the interlayer dielectric layer 32 and a portion of the contact spacers 35 is washed away so that the interfacial surface between the BPSG layer 30 and the interlayer dielectric layer 32, and the interfacial surface between the BPSG layer 30 and the junction region 25 are exposed. Accordingly, a cleaning solution infiltrates into the interfacial surfaces and sweeps the BPSG layer 30 at the interfacial surfaces, thereby forming empty spaces in the BPSG layer 30.

As a result, as shown in FIG. 1, in the formation of the bitline 40, the conductive material of the bitline 40 is deposited in empty spaces in the BPSG layer 30 so that a ring defect 45 is generated in the BPSG layer 30.

The ring defect 45 may acts a path of leakage current and may cause a short circuit between the gate electrode structure (G, a wordline) and the bitline 40.

SUMMARY OF THE INVENTION

To solve the above-described problems, it is a first object of the present invention to provide a semiconductor device that is capable of preventing a short circuit from occurring between a wordline and a bitline.

It is a second object of the present invention to provide a semiconductor device which is capable of preventing a ring defect from occurring around a bitline contact area.

It is a third object of the present invention to provide a method of manufacturing the semiconductor device.

Accordingly, to achieve the first and second objects, there is provided a semiconductor device according to a first aspect of the present invention. The semiconductor device includes a semiconductor substrate having a junction region, a planarization layer having a first contact hole portion through which the junction region is exposed, an interlayer dielectric layer formed on the planarization layer and having a second contact hole portion extended from the first contact hole portion, and contact spacers formed at the sidewalls of the first and second contact hole portions. Here, the contact spacers are formed to cover the interface between the planarization layer and the interlayer dielectric layer and the interface between the planarization layer and the semiconductor substrate.

To achieve the first and second objects, there is provided a semiconductor device according to a second aspect of the present invention. The semiconductor device includes a semiconductor substrate having a junction region, a planarization layer having a first contact hole portion, through which the junction region is exposed, an interlayer dielectric layer formed on the planarization layer and having a second contact hole portion extended from the first contact hole portion, and contact spacers formed at the sidewalls of the first and second contact hole portions. Here, the contact spacers are formed to cover the interface between the planarization layer and the interlayer dielectric layer and the interface between the planarization layer and the semiconductor substrate, the interlayer dielectric layer has a slower etching rate than the planarization layer in an etchant used to form the first and second contact hole portions, and the contact spacers are formed of a material having a slower etching rate than the interlayer dielectric layer and the planarization layer in a cleaning solution.

Preferably, the upper edge of each of the contact spacers is located higher than the upper surface of one portion of the interlayer dielectric layer having a smaller thickness than the other portions of the interlayer dielectric layer.

The junction region includes a groove, through which the interface between the planarization layer and the semiconductor substrate is exposed.

Preferably, the width of the portion of the junction region exposed between the contact spacers is smaller than the original width of the junction region.

The sidewalls of the first contact hole portion are formed as a bow shape, and the contact spacers are formed to sufficiently fill the depth of the bowed regions of the sidewalls of the first contact hole portion.

Preferably, the width of the contact spacers is greater than the distance between one sidewall of the second contact hole portion and the corresponding sidewall of the first contact hole portion.

The planarization layer may be a BPSG layer, and the interlayer dielectric layer may be a medium oxide layer deposited at a temperature of 750–800° C. The contact spacers may be formed of a silicon nitride (SiN) layer 18.

To achieve the third object, there is provided a method of manufacturing a semiconductor device. A semiconductor substrate having a junction region is provided. A planarization layer and an interlayer dielectric layer are sequentially deposited on the semiconductor substrate. A contact hole is formed to expose the junction region and the interface between the junction region and the planarization layer by etching predetermined portions of the interlayer dielectric layer and the planarization layer. Contact spacers are formed at the sidewalls of the contact hole. The surface of the semiconductor substrate is cleaned. A conductive line is formed to contact the exposed junction region. Here, the contact spacers are formed to cover the interface between the planarization layer and the interlayer dielectric layer and the interface between the planarization layer and the semiconductor substrate.

The interface between the planarization layer and the semiconductor substrate is exposed by excessively performing the etching process for forming the contact hole.

Preferably, the interlayer dielectric layer is formed of a material having a slower etching rate than the planarization layer in an etchant used to form the contact hole.

Preferably, the contact spacers are formed of a material having a slower etching rate than the interlayer dielectric layer and the planarization layer in a cleaning solution used to clean the surface of the semiconductor substrate.

For example, the planarization layer is formed of a BPSG layer, the interlayer dielectric layer is formed of a medium oxide layer deposited at a temperature of 750–800° C., and the contact spacers are formed of a silicon nitride (SiN) layer.

The cleaning solution may be a mixed solution of a $H_2SO_4$ solution and a SC1 ($NH_4OH+H_2O_2+H_2O$) solution.

The planarization layer is etched more than the interlayer dielectric layer in the etching process for forming the contact hole so that a predetermined distance exists between one side edge of the interlayer dielectric layer and the corresponding side edge of the planarization layer and so that the width of the contact spacers is greater than the predetermined distance between one side edge of the interlayer dielectric layer and the corresponding side edge of the planarization layer.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
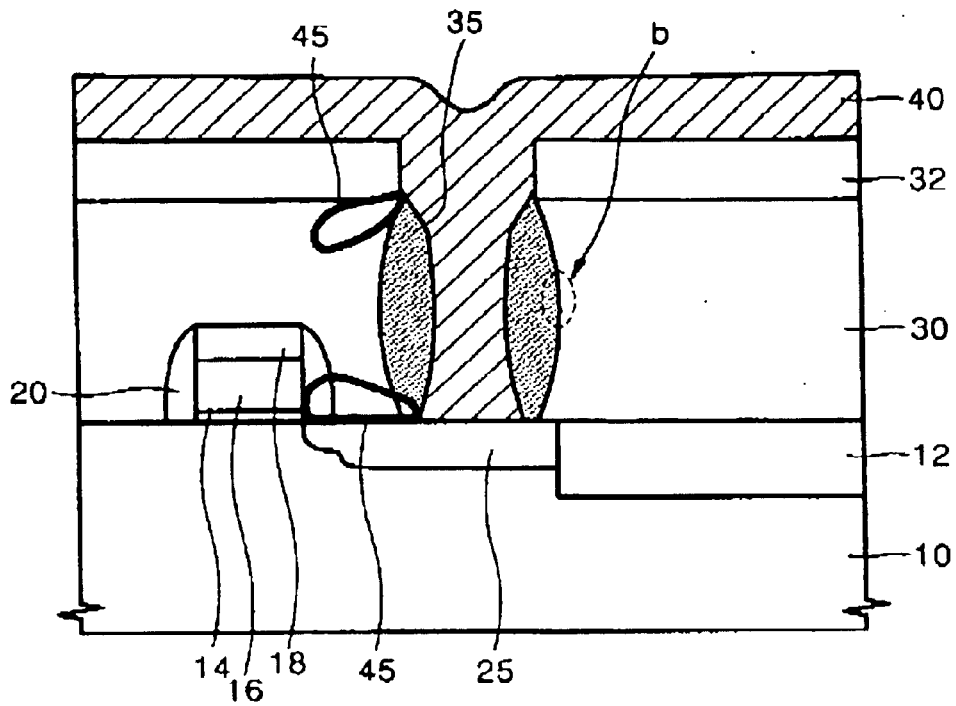
FIG. 1 is a cross-sectional view of a conventional semiconductor device having an interlayer dielectric layer formed of a BPSG layer.

The present invention will now be described more fully with reference to the accompanying drawings, in which preferred embodiments of the invention are shown. The invention may, however, be embodied in many different forms and should not be construed as being defined to the embodiments set forth herein. Rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. The same reference numerals in different drawings represent the same elements, and thus their descriptions will be omitted.

Figure 2A:
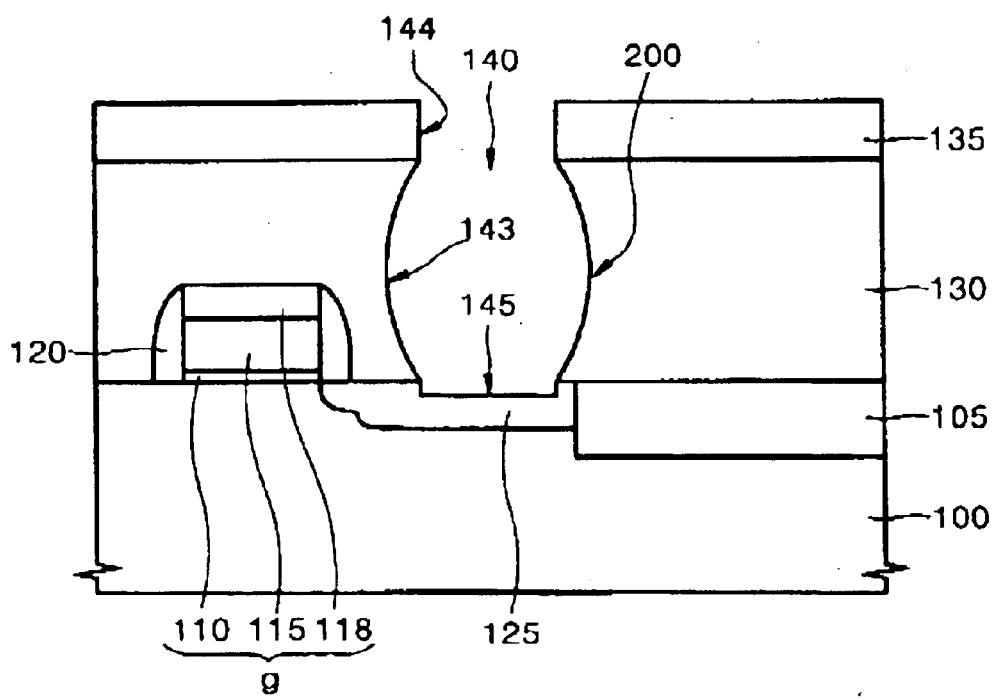
FIGS. 2A through 2C are cross-sectional views illustrating a method of manufacturing a semiconductor device according to the present invention.

Referring to FIG. 2A, an isolation layer 105 is formed on a semiconductor substrate 100 by, for example, shallow trench isolation (STI). A gate oxide layer 110, a conductive layer 115, and a capping layer 118 are sequentially deposited on the semiconductor substrate 100 and are patterned to form a gate electrode structure (G), i.e., a wordline. An insulation layer, for example, a silicon nitride (SiN) layer, is deposited on the semiconductor substrate 100 and is etched to form gate spacers 120 at either sidewall of the gate electrode structure (G) by blanket-anisotropic etching. Next, impurities of a certain conductivity type different from the conductivity type of the semiconductor substrate 100 are implanted into the semiconductor substrate 100 to form a junction region 125, thereby completing a transistor.

A BPSG layer 130 is deposited on the semiconductor substrate 100 to planarize the semiconductor substrate 100 having a step difference as much as the height of the gate electrode structure (G). Next, the BPSG layer 130 is flowed at a high temperature. The BPSG layer 130 is formed along the profile of the semiconductor substrate 100 when depositing the BPSG layer 130 on the semiconductor substrate 100 and is planarized by the flow process. An interlayer dielectric layer 135 is deposited on the flowed BPSG layer 130. The interlayer dielectric layer 135 is preferably formed of a material having a lower etching rate than the BPSG layer 130 in an etching process for forming a contact hole and a cleaning process. In the present embodiment, the interlayer dielectric layer 135 is formed of a medium temperature oxide layer, which is deposited at a temperature of 750–800° C., preferably, at a temperature of 780° C.

Next, the interlayer dielectric layer 135 and the BPSG layer 130 are etched to partially expose the junction region 125, thereby forming a contact hole 140. As disclosed herein, contact hole 140 comprises a first contact hole portion 143, and a second contact hole portion 144 extended from the first contact hole portion 143. Since the BPSG layer 130 is etched faster than the interlayer dielectric layer 135 formed of a medium temperature oxide layer, the sidewalls of the first contact hole portion 143 are formed as a bow shape, which is called a bowing phenomenon.

In FIG. 2A, reference numeral 200 represents the portion of the BPSG layer 130 at which the bowing phenomenon occurs. In the present embodiment, the etching process for forming the contact hole 140 is excessively performed to form a groove or trench 145 in the junction region 125. The depth of the groove 145 is smaller than the depth of the junction region 125. According to the formation of the groove 145, the interfacial surface between the junction region 125 and the BPSG layer 130 is exposed.

Figure 2B:
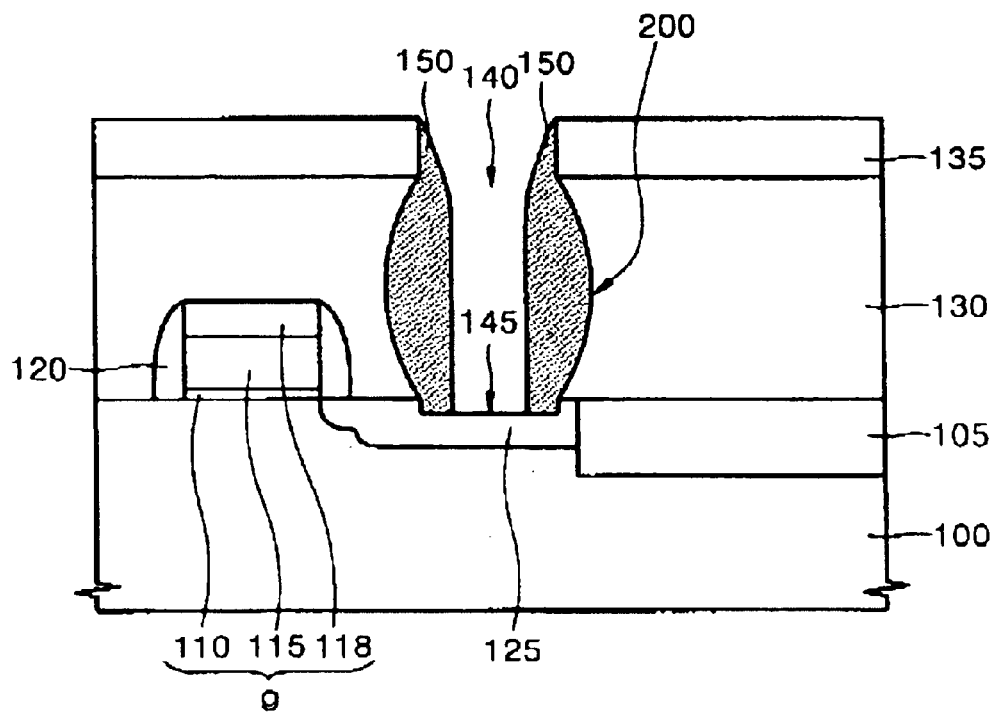

Referring to FIG. 2B, an insulation layer, for example, a silicon nitride (SiN) layer, is deposited to a predetermined thickness on the semiconductor substrate 100 and is etched to form contact spacers 150 by blanket-anisotropic etching. Here, the contact spacers 150 must be formed of a material having a lower etching rate than the BPSG layer 130 and the interlayer dielectric layer 135 in a cleaning process. Preferably, the contact spacers 150 may be formed of a silicon nitride (SiN) layer. The contact spacers 150 are formed to sufficiently cover the bowed sidewalls of the contact hole 140. In other words, the contact spacers 150 are formed to have a thickness greater than the depth by which the sidewalls of the contact hole 140 are recessed.

Figure 2C:
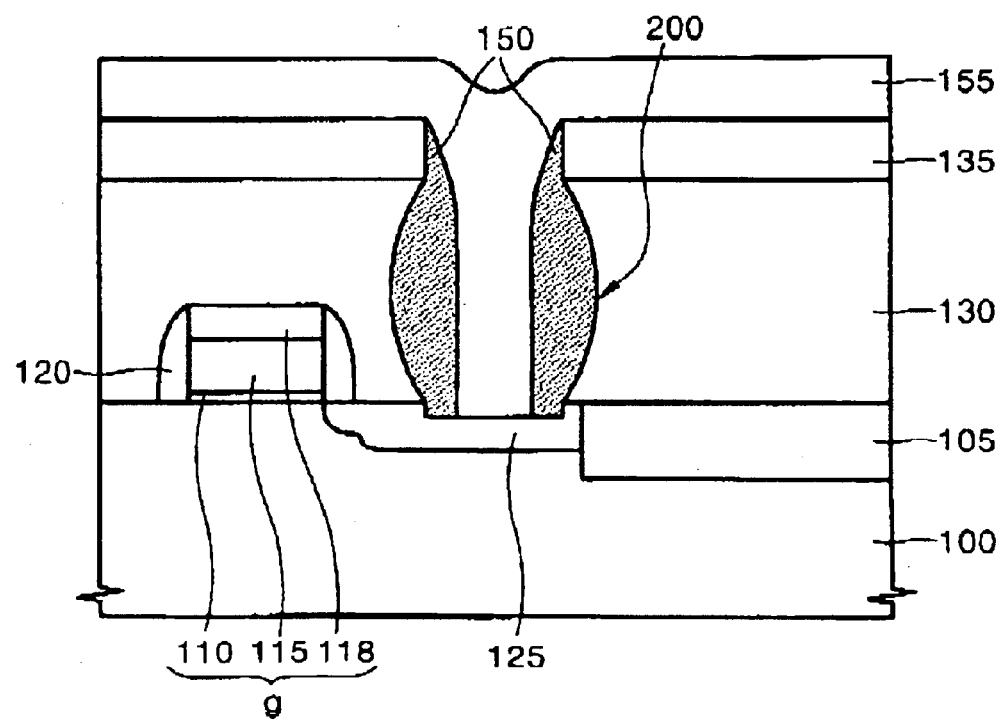

Next, the surface of the exposed junction region 145 and the surfaces of the contact spacers 150 are wet-washed, as shown in FIG. 2C. In the cleaning process, a mixed solution of a $H_2SO_4$ solution having a temperature of 145° C. and a standard chemical 1 (SC1) solution having a temperature of 40° C. may be used. In the cleaning process, the BPSG layer 130 is etched fastest, and the interlayer dielectric layer 135 is etched faster than the contact spacers 150. The cleaning process is performed for about 5–15 minutes. Since the contact spacers 150 show the lowest etching rate in the cleaning process, the contact spacers 150 can hardly be washed away and can remain on the sidewalls of the interlayer dielectric layer 135 even after the cleaning process. Accordingly, the contact spacers 150 still can protect the interfacial surface between the interlayer dielectric layer 135 and the BPSG layer 130 and thus can prevent a cleaning solution from infiltrating into the interfacial surface between the interlayer dielectric layer 135 and the BPSG layer 130.

The method of forming the contact spacers 150 according to the present invention, which can prevent a ring defect, will be described in greater detail with reference to FIG. 3.

Figure 3:
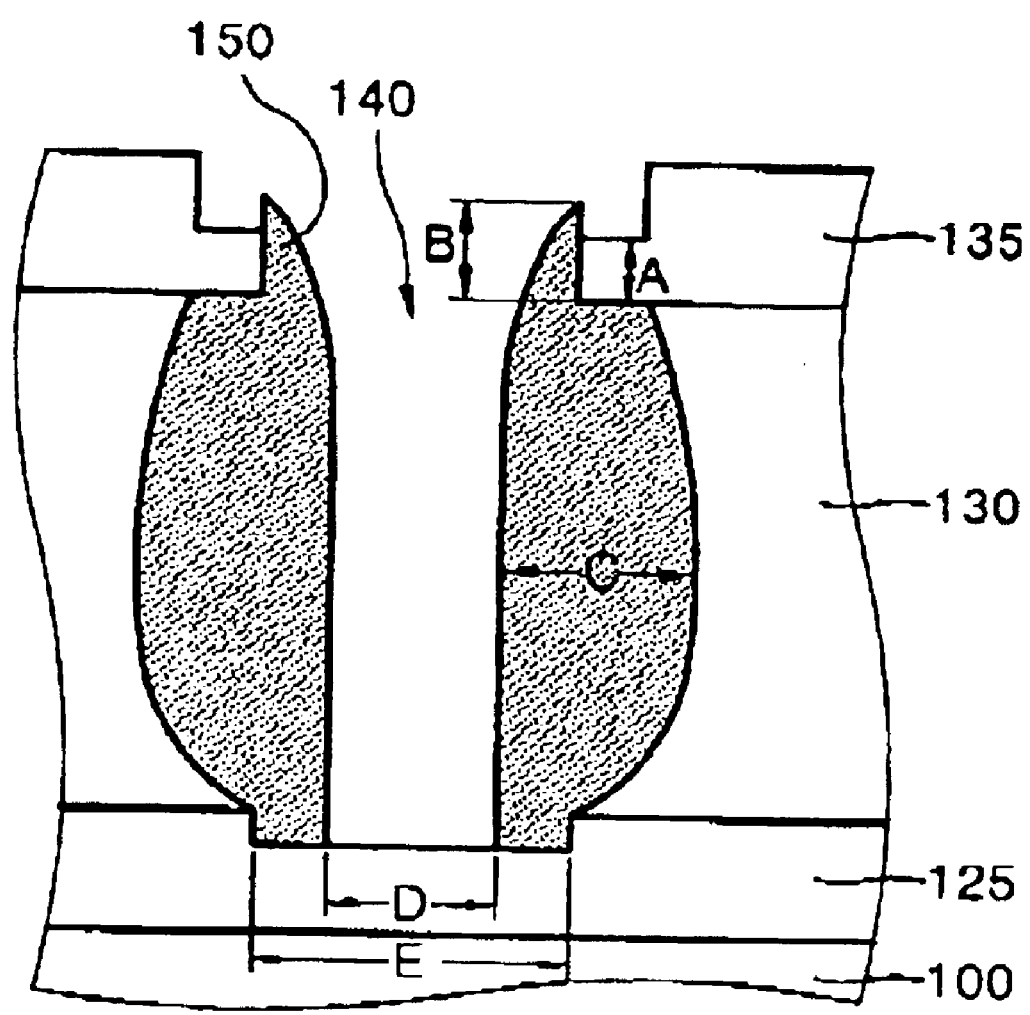
FIG. 3 is an enlarged view of a contact hole shown in FIG. 2B.

Referring to FIG. 3, the contact spacers 150 must remain on the sidewalls of the interlayer dielectric layer 135 even during a cleaning process. Preferably, while the cleaning process is performed, the distance "B" between the upper edge of each of the contact spacers 150 and the upper surface of the BPSG layer 130 is greater than the distance "A" between one edge of the interlayer dielectric layer 135 and the corresponding edge of the BPSG layer 130. In the cleaning process, the interlayer dielectric layer may be partially washed away, and thus the thickness of the interlayer dielectric layer 135 may be relatively small around the contact hole 140 compared to the thicknesses of other portions of the interlayer dielectric layer 135. In FIG. 3, "A" represents the thickness of the interlayer dielectric layer remaining below a corner which gets washed away in the cleaning process.

The width "C" of each of the contact spacers 150 must be greater than the depth "A" of the bowed region of the BPSG layer 130 in order to prevent a cleaning solution from infiltrating into the BPSG layer 130. In addition, the width "D" of the junction region 125 exposed between the contact spacers 150 must be formed to be smaller than the width "E" of the junction region 125 exposed by the BPSG layer 130 by over-etching the junction region 125 to a predetermined depth so that the interface between the BPSG layer 130 and the semiconductor substrate 100 can be covered with the contact spacers 150.

If the interface between the BPSG layer 130 junction region 125 of the and the semiconductor substrate 100, and the interface between the BPSG layer 130 and the interlayer dielectric layer 135 are protected by the contact spacers 150, it is possible to prevent a cleaning solution from infiltrating into the BPSG layer 130.

Referring to FIG. 2C, a conductive layer is deposited to contact the exposed junction region 125 and the exposed conductive layer 115 for a gate electrode and is patterned, thereby forming a bitline 155. Since there is no empty space in the BPSG layer 130 even after the cleaning process, it is possible to prevent a ring defect.

As described above, according to the present invention, the contact spacers 150 are formed to sufficiently protect the interface between the interlayer dielectric layer 135 and the junction region 125 of the BPSG layer 130 and the interface between the BPSG layer 130 and the semiconductor substrate 100, thus preventing a ring defect. Accordingly, it is possible to prevent a short circuit from occurring between a bitline and a wordline, i.e., a gate electrode.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor device comprising:
   a semiconductor substrate having a junction region;
   a planarization layer formed on the substrate and having an interface with the substrate and having a first contact hole portion through which the junction region is exposed;
   an interlayer dielectric layer formed on the planarization layer and having an interface with the planarization layer, the interlayer dielectric layer having a second contact hole portion extended from the first contact hole portion; and
   contact spacers formed at sidewalls of the first and second contact hole portions,
   wherein the contact spacers are formed to cover the interface between the planarization layer and the interlayer dielectric layer and the interface between the planarization layer and the semiconductor substrate, and wherein the junction region includes a groove through which the interface between the planarization layer and the semiconductor substrate is exposed.

2. The semiconductor device of claim 1, wherein the interlayer includes a first portion and a remainder, wherein a thickness of the first portion is less than a thickness of the remainder, and wherein an upper edge of each of the contact spacers is located higher than the upper surface of the first portion of the interlayer dielectric layer.

3. The semiconductor device of claim 1, wherein a width of the groove of junction region exposed between the contact spacers is smaller than the width of the junction region.

4. The semiconductor device of claim 1, wherein the sidewalls of the first contact hole portion are formed having a bow shape defining bowed regions, and the contact spacers are formed to sufficiently fill a depth of the bowed regions of the sidewalls of the first contact hole portion.

5. The semiconductor device of claim 1, wherein a width of the contact spacers is greater than a distance between one sidewall of the second contact hole portion and the corresponding sidewall of the first contact hole portion.

6. The semiconductor device of claim 1, wherein the interlayer dielectric layer has a slower etching rate than the planarization layer in an etchant used to form the first and second contact hole portions.

7. The semiconductor device of claim 6, wherein the planarization layer is a BPSG layer, and the interlayer dielectric layer is a medium oxide layer deposited at a temperature of 750–800° C.

8. The semiconductor device of claim 7, wherein the contact spacers are formed of a silicon nitride (SiN) layer.

9. The semiconductor device of claim 1, wherein the contact spacers have a slower etching rate than the interlayer dielectric layer and the planarization layer in a cleaning solution.

10. A semiconductor device comprising:
a semiconductor substrate having a junction region;
a planarization layer formed on the substrate and having an interface with the substrate, the planarization layer having a first contact hole portion through which the junction region is exposed;
an interlayer dielectric layer formed on the planarization layer and having an interface with the planarization layer, the interlayer dielectric layer having a second contact hole portion extended from the first contact hole portion; and
contact spacers formed at sidewalls of the first and second contact hole portions,
wherein the contact spacers are formed to cover the interface between the planarization layer and the interlayer dielectric layer and the interface between the planarization layer and the semiconductor substrate,
wherein the interlayer dielectric layer has a slower etching rate than the planarization layer in an etchant used to form the first and second contact hole portions, and the contact spacers are formed of a material having a slower etching rate than the interlayer dielectric layer and the planarization layer in a cleaning solution, and
wherein the junction region includes a groove through which the interface between the planarization layer and the semiconductor substrate is exposed.

11. The semiconductor device of claim 10, wherein the interlayer includes a first portion and a remainder, wherein a thickness of the first portion is less than a thickness of the remainder, and wherein an upper edge of each of the contact spacers is located higher than the upper surface of the first portion of the interlayer dielectric layer.

12. The semiconductor device of claim 10, wherein a width of the groove of the junction region exposed between the contact spacers is smaller than a width of the junction region.

13. The semiconductor device of claim 10, wherein the sidewalls of the first contact hole portion are formed as a bow shape, and the contact spacers are formed to sufficiently fill a depth of the bowed regions of the sidewalls of the first contact hole portion.

14. The semiconductor device of claim 10, wherein a width of the contact spacers is greater than the distance between one sidewall of the second contact hole portion and the corresponding sidewall of the first contact hole portion.

15. The semiconductor device of claim 10, wherein the planarization layer is a BPSG layer, the interlayer dielectric layer is a medium oxide layer deposited at a temperature of 750–800° C., and the contact spacers are formed of a silicon nitride (SiN) layer.

16. A method of manufacturing a semiconductor device comprising:
providing a semiconductor substrate having a junction region;
sequentially depositing a planarization layer and an interlayer dielectric layer on the semiconductor substrate, producing a first interface between the planarization layer and the substrate and a second interface between the planarization layer and the interlayer dielectric layer;
forming a contact hole to expose the junction region and the interface between the junction region and the planarization layer by etching predetermined portions of the interlayer dielectric layer and the planarization layer;
forming a trench in the exposed junction region of the semiconductor substrate;
forming contact spacers at the sidewalls of the contact hole, the contact spacers extending down to fill portions of the bottom of the trench of the exposed junction region;
cleaning the surface of the semiconductor substrate; and
forming a conductive line to contact the exposed junction region,
wherein the contact spacers are formed to cover the interface between the planarization layer and the interlayer dielectric layer and the interface between the planarization layer and the semiconductor substrate.

17. The method of claim 16, wherein the interface between the planarization layer and the semiconductor substrate is exposed by excessively performing the etching process for forming the contact hole.

18. The method of claim 16, wherein the interlayer dielectric layer is formed of a material having a slower etching rate than the planarization layer in an etchant used to form the contact hole.

19. The method of claim 18, wherein the contact spacers are formed of a material having a slower etching rate than the interlayer dielectric layer and the planarization layer in a cleaning solution used to clean the surface of the semiconductor substrate.

20. The method of claim 19, the planarization layer is formed of a BPSG layer, the interlayer dielectric layer is formed of a medium oxide layer deposited at a temperature of 750–800° C., and the contact spacers are formed of a silicon nitride (SiN) layer.

21. The method of claim 20, wherein the cleaning solution is a mixed solution of a H2SO4 solution and a SC1 (NH4OH+H2O2+H2O) solution.

22. The method of claim 16, wherein the planarization layer is etched more than the interlayer dielectric layer in the etching process for forming the contact hole so that a predetermined distance exists between one side edge of the interlayer dielectric layer and the corresponding side edge of the planarization layer and so that the width of the contact spacers is greater than the predetermined distance between one side edge of the interlayer dielectric layer and the corresponding side edge of the planarization layer.

* * * * *